United States Patent [19]
Hyduke

[11] Patent Number: 4,791,357
[45] Date of Patent: Dec. 13, 1988

[54] ELECTRONIC CIRCUIT BOARD TESTING SYSTEM AND METHOD

[76] Inventor: Stanley M. Hyduke, 513 Jenny Dr., Newbury Park, Calif. 91320

[21] Appl. No.: 19,641

[22] Filed: Feb. 27, 1987

[51] Int. Cl.⁴ ............................................. G01R 31/28
[52] U.S. Cl. .................................. 324/73 PC; 371/25
[58] Field of Search ........... 324/73 R, 73 PC, 73 AT; 371/25

[56] References Cited

U.S. PATENT DOCUMENTS 4,687,988  8/1987  Eichelberger et al. ........... 324/73 R Primary Examiner—Ernest F. Karlsen
Attorney, Agent, or Firm—David O'Reilly

[57] ABSTRACT

An Electronic Circuit testing system and method in which a test pattern is applied to an electronic circuit and captured by a sample capturing device. The test pattern is simultaneously applied to a functional schematic model of the electronic circuit under test and a calculated output signal representing the correct signal output of the electronic circuit is generated. The calculated output signal and the captured output signals are then compared to determine the signal changes for a given period of time. In comparing the two signals the number of transitions or tolerance differences of the two signals is determined and a malfunction in the signal is indicated by an excess of signal changes or tolerance differences. The method and the apparatus can also be applied to the design or a generation of electronic circuits.

8 Claims, 7 Drawing Sheets

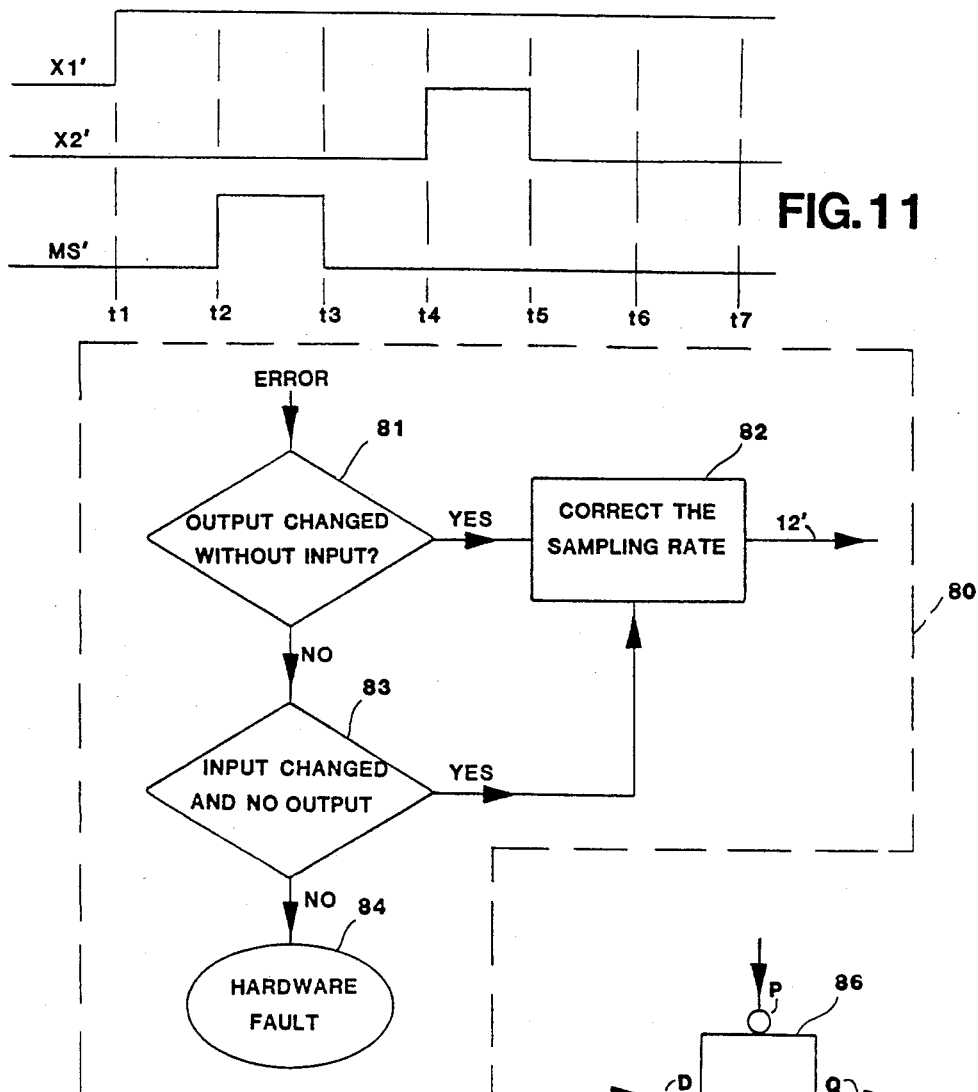
FIG. 11
FIG. 12
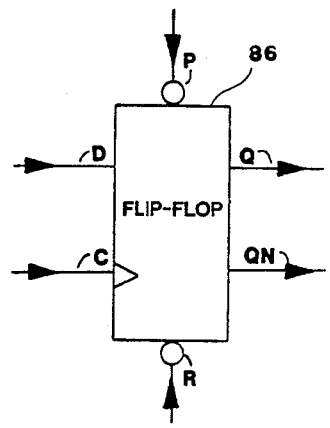
FIG. 13

ELECTRONIC CIRCUIT BOARD TESTING SYSTEM AND METHOD

FIELD OF THE INVENTION

This invention relates to testing of electronic circuit hardware such as printed circuit boards and equipment, and more particularly relates to an automatic computer controlled circuit testing system and method.

BACKGROUND OF THE INVENTION

The art of printed board testing is well established. One approach used to test and isolate faults in printed circuit boards is to feed the same test pattern into a known good board and the board under test. The same test points on both boards are then compared in real time to locate faults in the board under test. The apparent shortcoming of this method is a need for high speed signal comparators, cumbersome test point connections and maintenance of the reference board.

Another method of testing boards is to apply a known input test pattern to a good reference board, whose test point outputs are sent to a data capture unit, such as a logic analyzer, that causes an output test pattern file to be stored in a computer. The same input test pattern is then applied to the board under test and its test point outputs are compared with the stored output test pattern file for the good board. The major shortcoming of this method is that it does not allow the user to freely change the input test patterns for the board under test. As a result, the test is limited to a restricted set of input test patterns exercised with the good board.

Still another method of printed circuit board testing is to enter into a computer and store on a disk file the board's schematic. Then, a known input test pattern is applied under computer control to the aforementioned schematic and the schematic responses to this test pattern are stored by a computer in an appropriate output test pattern file. In the final step, the same input test pattern is applied to the board under test and its response is compared with the previously stored output test file. However, since the propagation delays assigned to the chips on the schematic strongly affect the resulting reference output signals, and since the propagation delays of the real chips vary from board to board, it is difficult to achieve good synchronization and reliable correlation between the calculated and asynchronously captured output signals from the test board.

Most presently used test methods and tools are based on a set of strictly predefined input test patterns. The user is not able to modify the input test patterns on the fly in order to adapt to a specific board malfunction. This is the major restriction that hampers the development of fully automated test equipment.

Another disadvantage of the test pattern based equipment is that it cannot test boards in a live system environment because the test patterns in use will vary in an unpredictable manner and it is impossible to create reference output test patterns apriori Still another disadvantage of the present test equipment is that it is based on specialized hardware, making the test equipment gear unduly restrictive and expensive.

The presently used predefined test patterns force a user to test boards with generalized test patterns, which may not be suitable for the given fault condition. As a result, the test is quite inefficient and unduly time consuming.

To optimize board test, the user must spend a considerable amount of time on manual tweaking of the test patterns. As a result, board test is an expensive and time consuming process that cannot be used on small production runs of printed circuit boards.

BRIEF DESCRIPTION OF THE INVENTION

It is an object of the present invention to improve test equipment for electronic hardware and make it free from the aforementioned limitations. Specifically, it is the object of this invention to accept dynamically changing input test patterns that are fed into electronic circuit hardware under test and feed them in parallel into an electronic circuit hardware schematic model, represented by software having a set of logic equations or signal processing formulae, and calculate the schematic model output test patterns to be used for checking the electronic circuit hardware responses.

Another object of this invention is to produce reference output test patterns from the functional schematic model of the electronic circuit being tested that are synchronized with the internal clock of the test system, resulting in simple signal analysis algorithms.

Moreover, it is the object of this invention to make the reference electronic circuit schematic model and computer processing means substantially independent of the operational speed of the board under test, to provide for universal test equipment that adapts to the operational speed of the circuit being tested through a flexible signal capture device. Furthermore, conventional data capture devices such as a logic analyzer and general processing means such as personal computers may be used. Thus, the invention provides for circuit board testing with commonly available, general purpose hardware.

It is a further purpose of this invention to provide means for automatically guiding the user through the test procedure, wherein the processing means establish the optimized test path and automatically displays bad components and faulty connections.

While the specification concludes with claims that distinctly specify and claim the subject matter which is regarded as the invention, it is believed that the novel features and advantages of the invention will be more fully understood from the following detailed description in conjunction with the accompanying drawings in which:

BRIEF DESCRIPTION OF THE DRAWINGS

FIG. 11 is a graph of signal timing in the AND gate of FIG. 2.

FIG. 12 is a flowchart of software for checking the sampling rate for proper electronic circuit board testing.

FIG. 13 illustrates a method of using a flip-flop device for creating electronic circuit models of sequential logic circuit devices.

DETAILED DESCRIPTION OF THE INVENTION

Figure 1:
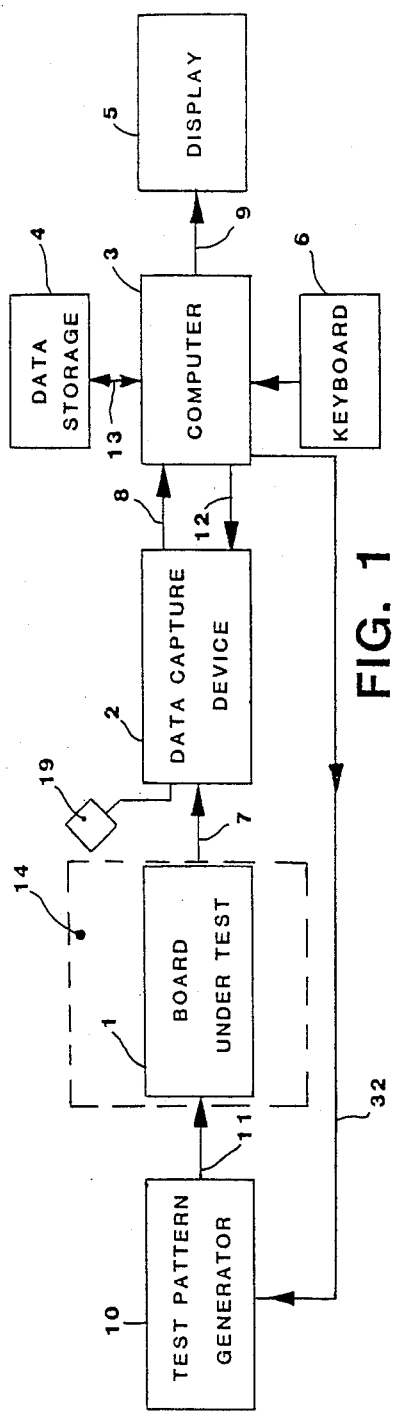
FIG. 1 is a block diagram of the circuit testing system according to the invention.

The invention applies to both digital and analog circuits. Proceeding now to the detailed description of the drawings, FIG. 1 illustrates a preferred embodiment of a fully automated circuit testing system according to the invention. Electronic circuit 1 on a board receives an input of test patterns at 11 provided by test pattern generator 10, which can be any combination of equipment such as a 91S32 and FG5010 made by Tektronix, or the like. An output at 7 of electronic circuit board 1 is captured by data capture device 2, which may be any combination of devices such as a DAS 9122 and 7612 D, made by Tektronix, or the like. The output at 8 from the data capture device is fed into computer 3 which can be a personal computer such as an IBM PC. Data transfer link 8, between data capture device 2 and computer 3 is provided via a standard RS-232 or IEEE-488 interface.

Computer 3 retrieves data from data storage device 4, via signal link 13, which includes an electronic circuit schematic model for the electronic circuit 1 under test. Computer 3 applies the input test patterns, received from data capture device 2, to the corresponding points on the electronic circuit schematic model provided by data storage device 4. Following this, computer 3 calculates the functional schematic model outputs for a digital logic circuit and the transfer function for an analog circuit, and compares them with corresponding electronic circuit board 1 outputs provided by data capture device 2. Any discrepancy between the calculated schematic model reference outputs and electronic circuit board 1 outputs is shown on display 5, being a CRT display or the like.

Display 5 indicates electronic circuit board 1 test status and guides the user in his troubleshooting effort by advising him what manual operation he should perform next. Display 5 also shows which signals have failed the test and which devices or signal paths on electronic circuit board 1 are malfunctioning.

The system and test equipment of the invention also operates in a live system environment. In this case, input signals 11 to electronic circuit board 1 under test are generated by other electronic circuits in a system 14, indicated in phantom, rather than by an external test pattern generator 10. Electronic circuit board 1 being a part of system 14 receives signals according to the system's operating conditions via a motherboard or discrete cabling wires. The process of automatic generation of output reference signals for comparison with signals from electronic circuit board 1 outputs is the same, independent of whether input test patterns at 11 are provided by a dynamically changing system environment in which electronic circuit board 1 normally resides, or by a test pattern generator 10.

Figure 2:
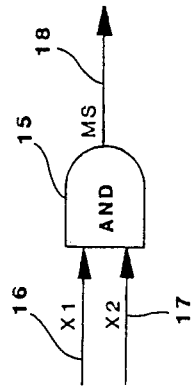
FIG. 2 is a schematic diagram of an AND logic gate.
Figure 5:
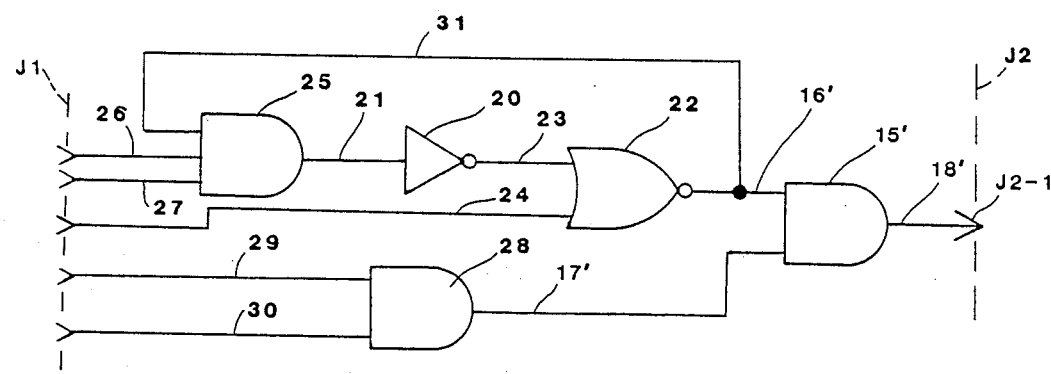
FIG. 5 is a schematic diagram of a typical circuit board being tested.
Figure 10:
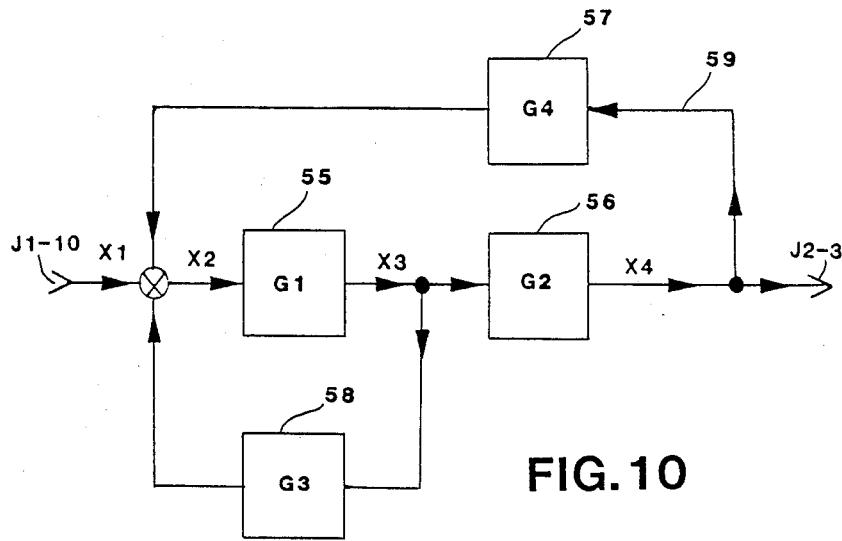
FIG. 10 is a logic diagram of a control system having multiple feedbacks.
Figure 7:
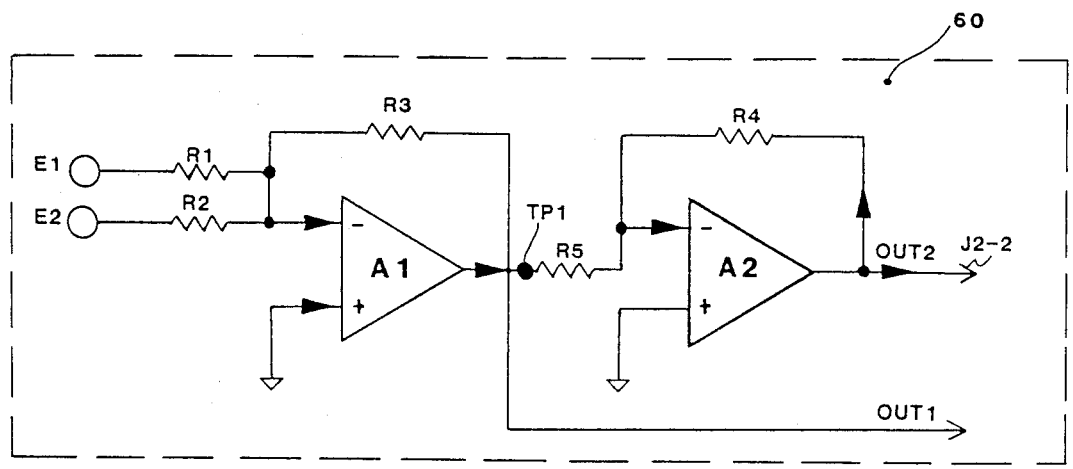
FIG. 7 is a schematic diagram of a typical analog circuit.

To better explain the invention, it will be described with reference to digital circuits as shown in FIGS. 2 and 5. Following this, the operation of the invention with analog circuits and control systems, as shown in FIGS. 7 and 10 respectively, will be described.

A detailed explanation of how the reference output test pattern is generated is described with reference to FIG. 2 in which AND logic gate 15 may be represented by Boolean logic equation (1):

$$F = x1 * x2 \qquad (1)$$

Figure 3:
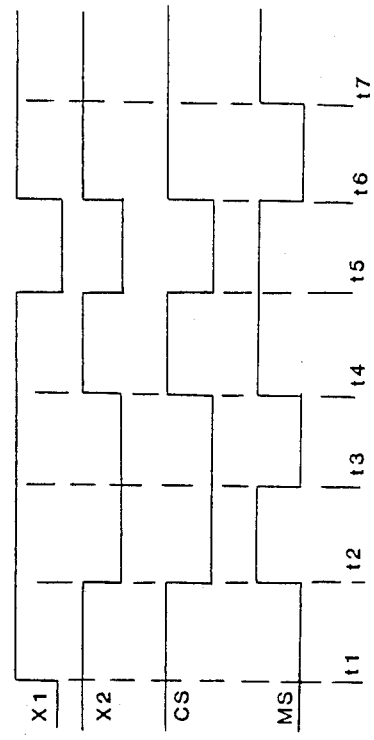
FIG. 3 is a graph of calculated and measured output waveforms from the AND gate of FIG. 2.

A sample input test pattern x1, fed on signal line 16, and x2 fed on signal line 17, may be as shown in FIG. 3. Output on signal line 18 may be calculated from equation (1), using an appropriate computer program written in any software language. An example of such a program written in 8088 assembly language is shown below:

$$\text{MOV a1, [x1]} \qquad (2a)$$

$$\text{AND a1, [X2]} \qquad (2b)$$

$$\text{MOV [CS], a1} \qquad (2c)$$

To simplify logic operations, an entire byte of memory is filled with the logic value of the signal by the system software. For example, if signal x1 is at logic 1 then it is stored in memory as eight bits of ones or 11111111. Similarly, if x2 is logical zero, then it is stored in memory as 00000000. This byte representation of each signal allows the use of byte oriented instructions and avoids time consuming operations on bits for which the general purpose processors such as 8088 are not suited. In view of the above explanation, the equations (2a), (2b) and (2c) operate as follows: the MOV command in equation (2a) is an assembly language command that takes variable from address [x1] and loads it to the lower byte of the accumulator a1. The AND command in equation (2b) logically ANDs the contents of memory location [x2] with the lower byte of accumulator a1. The MOV command in equation (2c) stores the result of AND logic operation from equation (2c) in memory location [CS].

Since software instructions 2a, 2b and 2c do not take into account the propagation delay of AND gate 15, calculated output waveform CS will be virtually coincidental with input signals x1 and x2. Moreover, since x1 and x2 signal waveforms are synchronized with the internal clock of data capture device 2, as represented by t1 through t7 clock timing samples of FIG. 3, and since there are no propagation delays included in AND gate 15 output signal calculations, calculated waveform CS is also synchronized with data captured device 2. This synchronization of calculated waveform CS with captured signals x1 and x2 is of paramount importance because it simplifies the software algorithms for hardware fault detection.

AND gate 15, when implemented by a SN7408 chip or the like, produces signal waveform MS on output signal line 18 that is time shifted with reference to inputs x1 and x2. This time shift is due to the propagation delay of AND gate 15. Since waveform signal MS is time shifted in reference to inputs x1 and x2, it is also time shifted with reference to calculated waveform signal CS. Moreover, since waveform MS is sampled by an asynchronous clock of data capture device 2, captured waveform MS may look quite different from calculated waveform CS of FIG. 3. If a simple logic level algorithm was used to compare waveforms CS and MS of FIG. 3, an error message would be produced for a properly operating AND gate 15.

To properly handle the propagation delay of waveform MS and provide reliable hardware fault detection, the invention tracks the sequence of logical transitions in both calculated waveform CS and measured signal waveform MS. Specifically, signal waveform MS must follow signal waveform CS and neither of these waveforms can have a double logic level transition during any steady state period of the other waveform. An example of implementation of this algorithm is shown in the software flowchart of FIG. 4.

Figure 4:
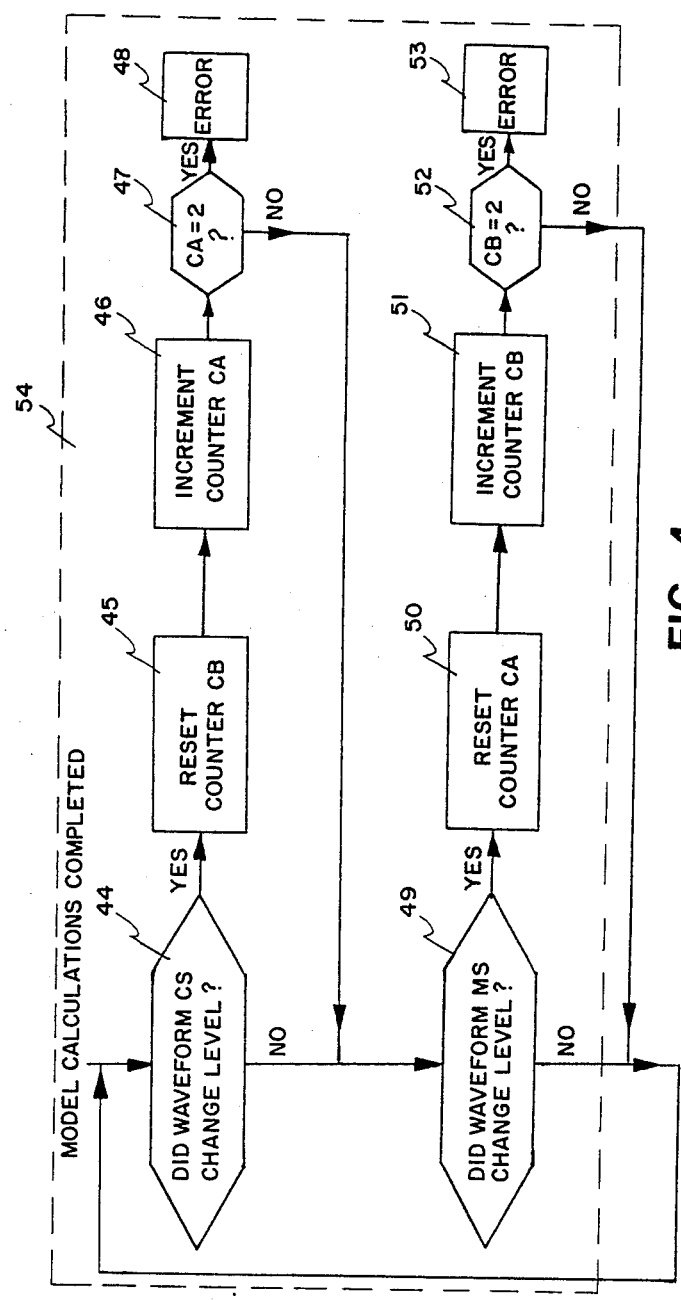
FIG. 4 is a flowchart of circuit processing software that detects hardware faults.

Referring now to FIG. 4, software program routine, represented by flowchart 54, residing in computer 3 checks by means of subroutine 44 if there has been a change in the logic level of waveform CS. The software of flowchart 54 has counters CA and CB for tracking logic level transitions in waveforms CS and MS, respectively. If there has been a change in the logic level of waveform CS, then counter CB, counting changes in waveform MS, is reset to 0 by subroutine 45, and counter CA is incremented by 1 by subroutine 46. Next, a test is performed by subroutine 47 to see if the contents of counter CA is equal to 2. If it is, then it means that waveform CS had two transitions during a steady state period of waveform MS, and an error in the operation of AND gate 15 is detected by software program routine 47 and indicated on display 5 controlled by subroutine 48. On the other hand, if the contents of counter CA is less than 2, the program branches and tests by means of subroutine 49 whether there was a change in the logical state of waveform MS. If there has been a change, then counter CA is reset by subroutine 50 and counter CB is incremented by 1 by subroutine 51 and tested by subroutine 52 to see whether it equals 2. If counter CB is not equal to 2 then program routine 54 branches to the beginning of the routine in the flowchart to test the changes in waveform CS. On the other hand, if counter CB is equal to 2, then an error in the operation of AND gate 15 is detected by software subroutine 52 and indicated on display 5 controlled by subroutine 53.

AND gate 15 and logic equation (1) illustrate the operation of algorithm represented by software routine 54 that detects hardware faults independent of the integrated circuit propagation delay effects. The algorithm of routine 54 takes care of any variations in the propagation delay of a tested logic circuit represented by AND gate 15 as long as the sampling interval of data capture device 2 is shorter than the pulse widths in the tested circuit. Numerous companies sell functional integrated circuit models that can be directly used by the algorithm of software routine 54. Functional software representations of integrated circuit models are available for numerous integrated circuits, including counters, decoders, latches, registers, programmable logic devices and other types of chips. Each of these functional representations is expressed in the equation (1) format, and can be directly implemented in conjunction with the algorithm represented by the software routine of flowchart 54.

Functional schematic moeels are created in the following manner. Combinatorial logic devices can be described by Boolean logic equations, similar to equation (1), and found in numerous books on logic design and logic device catalogs such as the 54/7400 TTL handbook by Texas Instruments. A new method of creating models for sequential logic devices that are in the format of logic equation (1) is illustrated by the use of a flip flop shown in FIG. 13. Since sequential logic devices are often responsive to signal edges, the invention provides means for detecting the edges of signal waveforms that are simulated devices. Specifically, the signal edge detection is provided by means implementing equation (9d) that carries the logic state of the signal waveform from one simulation cycle to the next and equation (9a) that logically ANDs the logic state of clock $C(-1)$ from the previous simulation cycle with the current logic state of signal C. Implementing means for equation (9a) is designed to detect a rising edge on the signal line C and produces a logic 1 when a positive edge is detected. Similarly, a negative edge transition of signal C is detected by equation: $C = -C*C(-1)$. The $C(-1)$ logic value is established by equation (9d) that is executed after the last use of signal C in the given simulation cycle.

$$C = C* - C(-1) \tag{9a}$$

$$Q = (-C*Q + C*D)* - R + S \tag{9b}$$

$$QN = -Q \tag{9c}$$

$$C(-1) = C \tag{9d}$$

The output signal line Q (FIG. 13) is processed according to equation (9b); the first term $-C*Q$ loads into output Q the current Q value if no signal C transition is detected. The second term $C*Q$ loads the current signal D logic value if a signal C transition is detected. The first and second terms are active if there is no active reset signal R. Alternatively, the output signal Q is set to logic 1 only if the preset line S is set. The QN signal is a complementary output of Q, and is therefore set to the complementary logic value of signal Q by implementing equation (9c).

Since all sequential devices have set, reset or clocking inputs, they can be described by a combination of equations in the format of equations (9a) through (9d). It is understood by those skilled in the art that counters, shift registers, latches and other sequential devices can be represented by the aforementioned logic equations (9a) through (9d). The models of these devices are stored in data storage device 4 and accessed by software 21, 47, 54 and other software routines in computer 3 as needed to perform the specified functions.

The system of the invention provides all necessary means for full automation of electronic circuit board testing. The logic circuit of FIG. 5 illustrates in greater detail a circuit which may be a part of the electronic circuit board 1. Since all practical electronic circuit board testing starts with a go-no-go test at the board connector edge, all inputs and outputs of board 1 are captured through edge connectors J1 and J2 by data capture device 2 and send to computer 3 for fault analysis.

The functional simulation of the entire circuit of FIG. 5 can be generated by a conventional functional simulator or by a computer with appropriate software as described previously. Since the data capture device 2 transmits to computer 3 all inputs into electronic circuit board 1, including signals on lines 24, 26, 27, 29 and 30, computer 3 can feed these signals into a functional simulator and automatically calculate an output waveform CS on signal line 18. Since computer 3 also receives signal MS, being the actually measrred logic state of signal line 18' at connector J2-1, the algorithm represented by software routine 54 can determine if the circuit of FIG. 5 is operating correctly or not.

Figure 6:
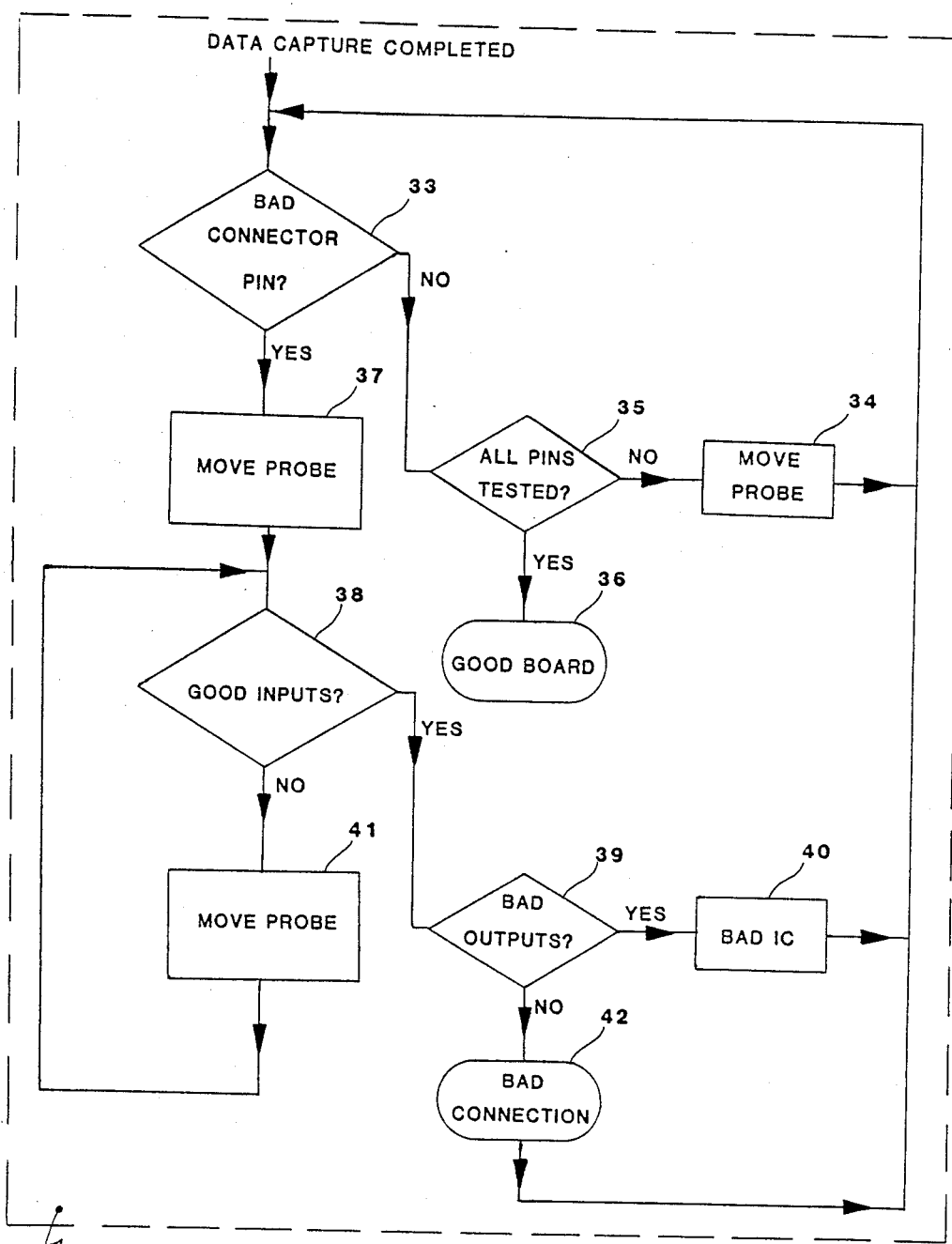
FIG. 6 is a software flowchart illustrating the automatic guidance given to a technician performing a test.

Referring now to the software flowchart shown in FIG. 6, the principles of the computer guided troubleshooting process can be seen. Data capture device 2 has clip test probe 19, shown in FIG. 1 which is a group of contacts connected to data capture device 2 by a cable and put together into one mechanical assembly for ease of clipping onto chips. One such test probe is readily available and known as a Proto-Clip PC-16, manufactured by Global Specialties. The contacts of the clip test probe match the terminals of chips allowing the test probe to be easily moved from one chip to another by the user as instructed by computer 3 commands.

The software routine represented by flowchart 21 (FIG. 6) in computer 3 checks by means of subroutine 33, which includes subroutine 54 (FIG. 4), if any output of connector J2 signal line is failing. Should signal line 18', as measured at connector J2-1 (FIG. 5), show a fault, subroutine 37, which knows from electronic circuit board 1 functional model or netlist loaded into computer 3 from model data storage device 4 which chip generates that output, automatically directs the user to place test probe 19 on chip 15' producing the failed output 18'. An input prompt from the user on keyboard 6 as directed by computer 3 causes a command on signal line 32 to test pattern generator 10 to repeat the test pattern that previously created an error on signal line 18'. Computer 3 receives all the inputs and outputs from suspected chip 15' via test probe 19 and data capture device 2. First, the program in computer 3 calculates the signals fed into chip 15' and then compares them with corresponding input test signals provided by test probe 19. Inputs 16' and 17' of chip 15' are calculated by the program in computer 3 from the functional model of the schematic in FIG. 5, producing equations (3a) and (3b), respectively, in which the numbers represent the signals on the signal lines of FIG. 5.

$$16' = -[-(26*27*18') + 24] \quad (3a)$$

$$17' = 29*30 \quad (3b)$$

Software routine 38 checks by means of subroutine 54 if input signals 16' and 17' are error-free. If chip 15' inputs are error-free, then subroutine 39 checks through subroutine 54 if chip 15' output is error-free. If the output signal on signal line 18' is bad, then subroutine 40 indicates on display 5 a message that chip 15' is bad. However, if inputs 16' and 17' are good and the output signal on signal line 18' is good then chip 15' is good, and subroutine 42 indicates on display 5 that the connection between chip 15' output and connector J2-1 is at fault.

The software program in computer 3 produces a list of connections called a connectivity list from electronic circuit board 1 schematic model. If any of the inputs into a chip under test such as chip 15' is found bad, e.g. 16', then using the connectivity list, the program in computer 3 automatically directs the user to place test probe 19 on chip 22 that connects to faulty signal line 16'. Following this, computer 3 initiates via signal line 32 (FIG. 1) the original test pattern that has produced the fault at connector pin J2-1. Analysis of chip 22 is then performed in a similar manner as the analysis of chip 15'. By moving test probe 19 from the bad signal line destination to its source, the user can find the source of failure, being either a bad connection between the signal source and receiver, or a bad chip that generates a faulty signal. By using algorithm represented by software flowchart 21, described with reference to FIG. 6, the programmed computer 3 can provide fully automated step-by-step guidance in hardware troubleshooting.

There are many methods of implementing the algorithm of flowchart 21; e.g. input signals at 11 (FIG. 1) can be directly generated by computer 3 and fed through signal line 32 into test pattern generator 10. Since the timing of signals 11 is known to the programmed computer 3, a sample of the output need not be captured by data capture device 2.

The timing for AND gate 15 of FIG. 2 in which a change in the output signal is detected though there is no change on input x2 is shown by the graph of FIG. 11. This can happen if the sampling rate of data capture device 2 is too slow because it may fail to detect some of the signal changes. Software in computer 3 represented by flowchart 80 shown in FIG. 12, checks whether the sampling rate of data capture device 2 is sufficient to properly test electronic circuit board 1. The error signal from software of flowcharts 48 and 53 is fed into software subroutine 81 that checks whether there was a change in the output signal MS' without a corresponding change on its input x1' or x2' within the previous clock cycle of data capture device 2. If there was a change in output signal MS' without an appropriate input change, then the software of flowchart 80 detects a sampling rate error. Subroutine 82, by means of line 12', issues a command to data capture device 2 to increase its sampling rate and the test of electronic circuit board 1 is repeated with the new sampling rate.

Similarly, software subroutine 83 checks whether a single clock change is detected on the input signal line without a corresponding change on AND gate 15 output signal line, and whether input signals longer in duration than a single clock cycle are affecting the output. If this is the case, the sampling rate of data capture device 2 is too slow. Upon detecting too slow sampling rate, software subroutine 80 increases the sampling rate via subroutine 82 that controls signal line 12, and the test of electronic circuit board 1 is repeated again. However, if a detected hardware fault is not indicated by either software subroutines 81 or 83 as a sampling error, then it is indicated by software subroutine 84 as real hardware fault and displayed accordingly on display 5.

The system is substantially independent of the operational speed of the circuit under test because computer 3 operates in an off-line mode with reference to the measured test patterns and testing is limited only by the speed of data capture device 2 and test pattern generator 10. As a result of the above consideration, the entire test software routines 21, 47 and 54, residing in computer 3, are also immune to the speed of electronic circuit board 1 being tested. The data 11 fed by test pattern generator 10 into electronic circuit board 1 is segmented into pieces to comply with data capture device 2 storage capacity. Each segment of the test pattern can be fed under control of computer software 3 via signal line 32.

Signal line 31 forms a feedback loop in the circuit shown in schematic FIG. 5. If there is a fault on signal line 24, gate 22 output 16' will be incorrect. Since signal line 16' feeds back to gate 25 via signal line 31, gate 25 will show a faulty output at 21 even if operating correctly. Feedback loops normally preclude fault isolation at the chip level because a fault in one chip propagates forward and backward throughout the entire feedback loop.

Normally, a user is required to disconnect all feedback loops on a printed circuit board to facilitate fault location. Disconnecting of feedbacks is labor intensive, prone to mistakes and often results in damaged boards. To resolve the feedback loop problem two methods of testing printed circuit boards and equipment without removing their feedback loops are described hereinafter.

The signal on output signal line 18' in FIG. 5 can be calculated from logic equation (4) where the numbers represent the signal on the respective lines:

$$18' = [-(31*26*27)+24]*(29*30) \quad (4)$$

Signal line 31 in equation (4) is driven by the output of gate 22 and is dependent upon the logic circuit behavior. All other signal lines in equation (4) are connector pins. They are directly measured by data capture device 2 and are totally independent of the circuit's behavior. If signal line 31 is measured by data capture device 2 and this information is then fed into logic equation (4) in place of the calculated signal on line 31, then the feedback loop effect is completely eliminated because the equation (4) is now exclusively dependent upon measured logic signals. Therefore, taking a measurement of a signal on a feedback signal line and feeding it into the circuit equations, eliminates the need for disconnecting any feedbacks on the tested board 1 or equipment 14.

The signals on schematic feedback lines can be automatically located by the computer 3 software that analyzes the graph of integrated circuit connectivity list. The user can then manually select the best point for feedback line test probe attachment. If a user is unfamiliar with the schematic and feedback loops then he may have a problem in locating them. To help those users, the invention provides still another method of overcoming the feedback loop problem.

Referring back to FIG. 5, it will be assumed that the signal on line 24 is faulty. If test probe 19 is located on chip 22, then according to the invention, the waveform measured on signal line 16' will be fed into the schematic functional model and replace calculated signal CS from equation (3a) for line 16'. As a result of this substitution of the measured logic waveform signal in place of the calculated one, calculated output signal 18' adapts itself to real on-board signal conditions and the calculated feedback signal on line 31 fed into gate 25 will be the same as in the real hardware, represented here by electronic circuit board 1. The calculated output signal on signal line 23 will be the same as the measured one. This method works in substantially every situation if testing proceeds "from right to left", as directed by the algorithm of flowchart 21. On the other hand, if the user tries to bypass software flowchart 21 recommendations and skips chip 22 test, going directly to gate 25, he will get an indication that feedback loop 31 is faulty, and he will be advised by computer 3 to place test probe 19 on gate 22. Thus, feedback loops can be successfully tested without knowing where they are.

If any chip fails in a feedback loop circuit, all chips may show incorrect outputs. The only known method of testing feedback loops is to physically break the loop by either grounding or disconnecting certain signal lines. This problem is automatically eliminated if the programmed computer 3 uses an algorithm that feeds the measured signals directly into the corresponding points in logic equations representing the model.

The algorithm can be more fully understood by referring to FIG. 5 schematic. If there is a fault in inverter 20 and data capture device 2 test probes are placed on output signal lines 21, 23 an 16', they all will show an error due to the feedback on line 31. However, if the calculated signal waveforms on signal lines (21), (23) an (16') are replaced in the equations by the measured waveforms at the corresponding test points, then signal lines 16' and 21 will show as being good, and signal line 23 will show as faulty. Feeding the measured signal values into calculated logic equations stops transmission of hardware faults, and automatically suppresses false fault indications.

The algorithms for testing of digital circuits apply also to analog circuits and control systems, and they can also be tested using FIG. 1. equipment configuration. Analog circuits and control systems are described in terms of their transfer functions instead of the logic equations, used with the digital circuits shown in FIGS. 2 and 5. Transfer functions are known and described in great detail in handbooks on linear circuits and control systems and need not be repeated here.

An example of analog circuit, which may be a part of an electronic circuit board 1, is shown in FIG. 7. The functional model of the transfer function for circuit 60 can be provided by numerous analog circuit simulation tools such as XFER available from BV Engineering or by manual calculations. The transfer functions for outputs OUT1 and OUT2 are shown in equations (5) and (6).

$$OUT1 = -R3(E1/R1 + E2/R2) \quad (5)$$

$$OUT2 = (R3*R4/R5) * (E1/R1 = E2/R2) \quad (6)$$

$$OUT2 = R4/R5*OUT1 \quad (7)$$

Equations (5), (6) and (7) can be used to calculate the nominal, minimum and maximum values of the aforementioned resistors, shown in FIG. 7. By using minimum tolerance values for resistors R1, R2 and R5 in the denominator of equations (5) and (6), and maximum tolerance values for resistors R3 and R4 in the numerator of the aforementioned equations, the maximum value or gain of signals OUT1 and OUT2 may be calculated from subroutine 48. Similarly, by substituting maximum tolerance values for R1, R2 and R5, and minimum tolerance values for R3 and R4, the minimum OUT1 and OUT2 signal values or gain are calculated from equations (5), (6) and (7) from subroutine 51.

Figure 8:
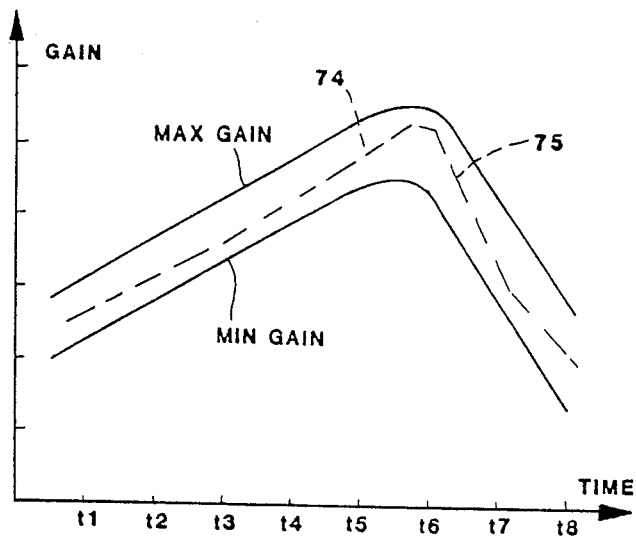
FIG. 8 is a graph illustrating calculated and measured analog signals.

When known input signals e1 and e2 are fed into the circuit of schematic 60, computer 3 can calculate the maximum and minimum expected signal values for outputs OUT1 and OUT2. The minimum and maximum signal values form tolerance band 74, shown in the graph of FIG. 8 displayed by computer 3 on display 5 to provide visual information as to the safety margin between measured signal 75 and safety zone 74.

Figure 9:
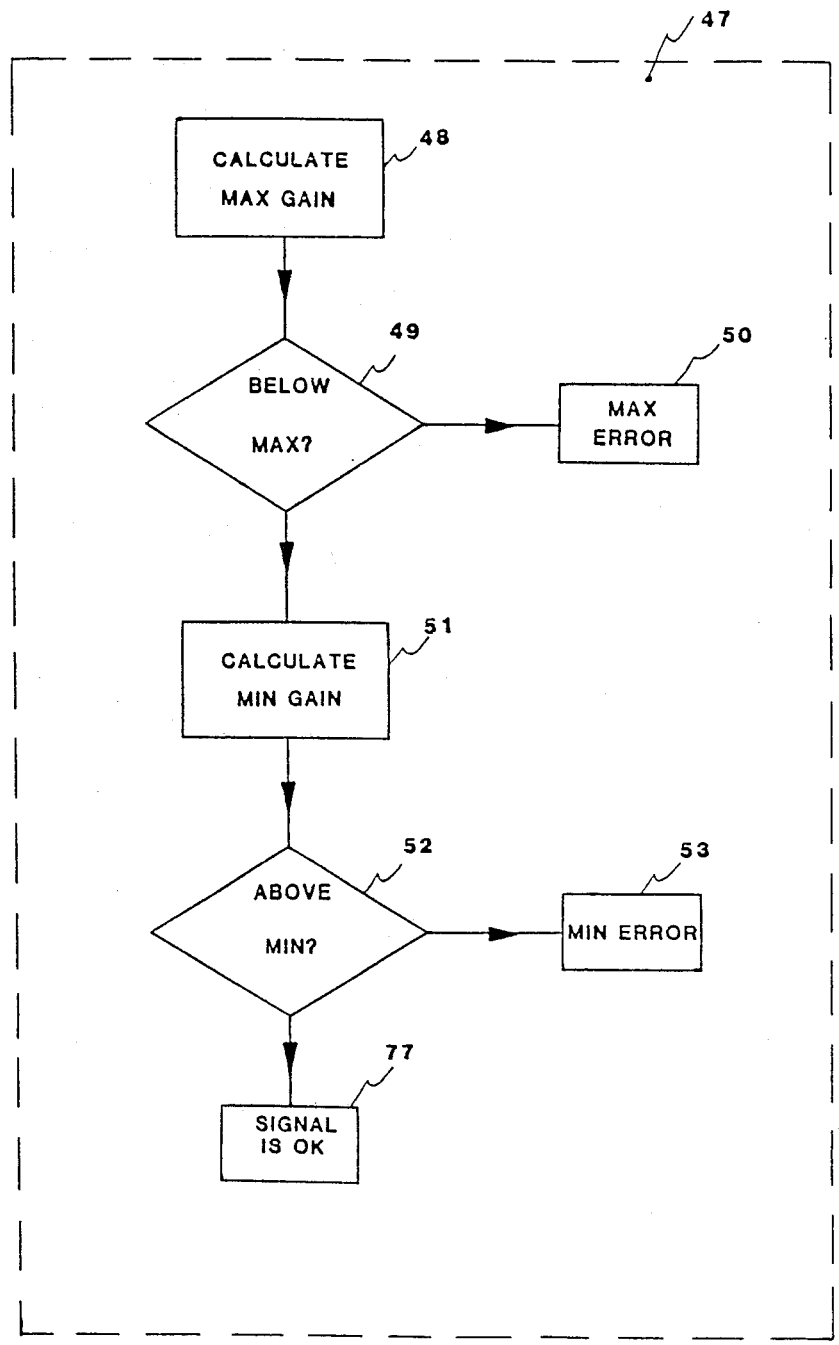
FIG. 9 is a software flowchart illustrating the steps followed in analog signal tolerance calculations.

Inputs E1 and E2 may be provided either from the environment of system circuit 14 (FIG. 1) or by separate analog waveform generators such as an FG 5010, manufactured by Tektronix. Output at J2-2, OUT1 and OUT2 in the circuit of schematic 60 can be captured by data capture device 2, being any digitizer such as a 7612D, manufactured by Tektronix. The resistor values R1, R2, R3 and R4 are given by the circuit design. If an error in the signal value at connector pin J2-2 has been detected by software subroutine 33, subroutine 37 directs a user to place test probe 19 on chip A2. Following this, subroutine 38 will calculate whether the inputs into circuit component A2 are within tolerance. If the inputs are within tolerance, then software subroutine 47 of FIG. 9, which is a part of software subroutine 39 (FIG. 6), calculates from equation (7) whether output signal OUT2 is correct. If OUT2 is within the calculated tolerance and J2-2 is bad, then the problem is in the connection between circuit component A2 output and J2-2. However, if OUT2 is out of tolerance, then circuit component A2 is bad. Since operational amplifier circuit component A2 inputs are at virtual ground, computer 3 automatically directs the user to take an input signal measurement at TP1 and uses this signal value in the calculations of equations (6) and (7).

If any of resistors R4 or R5 is a potentiometer, then the gain of circuit component A2 can be adjusted by feeding measured OUT1 signal into OUT2 calculations represented by equation (7), and observing on display 5 the calculated tolerance band 74 and measured OUT2 signal 75. This is a new method of quick circuit gain adjustment independently of any circuit feedbacks. Therefore no feedbacks have to be disconnected to perform a circuit test or adjustment. Should there be any feedback between circuit components A2 and A1, the errors will not propagate from circuit component A2 to circuit component A1 if the aforementioned algorithm of feeding measured signals into calculated equations is used.

To find an analog hardware fault, computer 3 executes the same software routines shown in flowchart 21 (FIG. 6) except that subroutine 54 used for digital circuits is replaced by subroutine 47 that calculates signal gain tolerances. Software routine 38 that checks whether the digital input signals are logically correct, now checks whether the input analog signals are within the calculate tolerance, as explained above with reference to FIG. 7 an FIG. 8. Software subroutine 47 (FIG. 9) includes software subroutines 48 and 51 that calculate the minimum and maximum circuit gains, respectively, from the circuit transfer function and component tolerances. Such software programs are readily available from numerous sources, such as Hewlett-Packard Corporation. Software subroutines 49 and 52 check whether measured output signal MS is within the range of tolerance band 74 calculated by software subroutines 48 and 51. Subroutines 50 and 53 display error messages on display 5 if the measured signals are above or below the calculated tolerances, respectively.

The present invention pertains to control systems, such as that illustrated in FIG. 10. If an element within the control system is of a digital type, then it is handled by subroutine 54. However, if it is analog in nature, then it is handled by subroutine 47.

The following equation (8a), (8b) and (8c) represent the control system in FIG. 10.

$$x2 = x1 + x3*G3 + x4*G4 \quad (8a)$$

$$x3 = x2*G1 \quad (8b)$$

$$x4 = x3*G2 \quad (8c)$$

Since there are some feedbacks in the system, an error in any of circuit elements G1, G2, G3 or G4 effects other elements in the loop. To deal with this situation, the software routine of flowchart 21 (FIG. 6) can be used. If an error has been detected at connector pin J2-2, then subroutine 37 directs movement of data capture test probe 19 to circuit element G2. Since this includes feedback loop 59 via element G4, measured signal x3, on the input of circuit element G2, should be fed into calculated equation (8c). The process for testing a control system illustrated in FIG. 10 is shown by the software routine of flowchart 21 and it is identical with the digital and analog circuit testing, described previously with reference to FIGS. 1 through 9. The user can develop a control system as shown in FIG. 10 by feeding Step-by-Step measured signals into circuit components modifying them to produce predetermined characteristics. Thus the system can also be used effectively for circuit design.

This invention is not to be limited by the embodiment shown in the drawings and described in the description, which is given by way of example and not of limitation, but only in accordance with the scope of the appended claims.

What is claimed is:

1. An electronic circuit board testing system comprising:

means for applying a signal test pattern input to an electronic circuit board being tested;
   data capture means capturing an output signal sample from said circuit board;
   data storage means storing an electronic circuit schematic model of said circuit board under test;
   means for applying input signal test pattern received from said data capture means to corresponding points on said electronic circuit board schematic model retrieved from said data storage means;
   calculating means for generating calculated signal sample representing the functional schematic model outputs from said signal test pattern input; and
   comparing means comparing the functional schematic model calculated signal sample with the captured signal sample from said electronic circuit board being tested captured by said data capture means;
   whereby defect in said electronic ciruict board being tested are determined by discrepancies between the calculated signal samples form paid functional schematic model outputs and captured signal sample from said electronic circuit board outputs.

2. The testing system according to claim 1 in which said comapring means determines the number of signals transistions of said captured signal sample and calculated signal sample relative to one another for a steady state period; whereby two or more transitions in a steady state period indicate an error in said captured output signal.

3. The system according to claim 1 in which said comparing means determines whether the captured signal sample has exceeded the maximum and minimum gain tolerances of said calculated signal; whereby circuit malfunctions may be determined by detecting captured signal samples exceeding the gain tolerances of the calculated signal sample.

4. The system according to claim 1 in which said calculating means for generating a calculated signal sample comprises computer processing means; said computer processing means generating said calculated signal by applying said test pattern signal to a functional schematic model of said electronic circuit means.

5. The system according to claim 4 including digital data storage means storing said functional model of said electronic circuit means for loading into said computer processing means on command.

6. The system according to claim 4 including means measuring feedback signals of said electronic circuit means; and means for applying said measured feedback signal to said functional schematic model.

7. The system according to claim 4 including means for testing the sampling rate of said data captive means; and means for adjusting the sampling rate whereby the sampling rate may be automatically increased if incorrect.

8. The system according to claim 4 including display means receiving and displaying the output from said computer processing means to automatically guide a user by displaying the sequence of connections to be tested, whereby a bad signal is automatically traced by said computer processing means.

* * * * *